US012666919B2

(12) United States Patent
Yasui

(10) Patent No.: US 12,666,919 B2
(45) Date of Patent: Jun. 23, 2026

(54) TENSION GENERATION DEVICE AND SEMICONDUCTOR MANUFACTURING DEVICE

(71) Applicant: Mitsubishi Electric Corporation, Tokyo (JP)

(72) Inventor: Satoshi Yasui, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 232 days.

(21) Appl. No.: 18/414,394

(22) Filed: Jan. 16, 2024

(65) Prior Publication Data
US 2024/0339350 A1 Oct. 10, 2024

(30) Foreign Application Priority Data
Apr. 5, 2023 (JP) .................................. 2023-061643

(51) Int. Cl.
*H01T 23/00* (2006.01)
*H10P 72/72* (2026.01)
(52) U.S. Cl.
CPC .................................. *H10P 72/722* (2026.01)
(58) Field of Classification Search
None
See application file for complete search history.

(56) References Cited

U.S. PATENT DOCUMENTS

2003/0039016 A1* 2/2003 Vaganov ............ G02B 26/0841
359/224.1
2005/0095776 A1* 5/2005 Usuami ............... H01L 21/6833
438/232

FOREIGN PATENT DOCUMENTS

JP 2003-224054 A 8/2003

* cited by examiner

Primary Examiner — Stephen W Jackson
(74) Attorney, Agent, or Firm — Studebaker Brackett PLLC

(57) ABSTRACT

According to an aspect of the present disclosure, a tension generation device includes a plurality of electrode pairs each including a first electrode and a second electrode and a voltage application circuitry that is configured such that each of the plurality of electrode pairs is arranged so as to interpose an end portion of a wafer by the first electrode and the second electrode in a direction perpendicular to a principal surface of the wafer, and a voltage is applied between the first electrode and the second electrode of each of the plurality of electrode pairs in a state where the first electrode and the second electrode protrude to an outer side than the wafer when seen in the direction perpendicular to the principal surface of the wafer.

11 Claims, 4 Drawing Sheets

FIG.3

TENSION GENERATION DEVICE AND SEMICONDUCTOR MANUFACTURING DEVICE

BACKGROUND

Field

The present disclosure relates to a tension generation device and a semiconductor manufacturing device.

Background

JP 2003-224054 A discloses a semiconductor exposure device. In this device, when a deformed wafer is sucked to an electrostatic chuck, a force is in advance exerted in a radial direction of the wafer, and the wafer is mechanically and forcibly deformed to a state close to a flat surface. While the above state is maintained, the wafer is placed on the electrostatic chuck, electrostatic suction is performed, and flatness correction can thereby be performed for the wafer to predetermined flatness. As one example of forcible deformation means, a configuration is possible in which the forcible deformation means is provided on a wafer conveyance hand, mechanically clamps a plurality of points of an outer peripheral end of the wafer, and exerts a force in the radial direction of the wafer.

In JP 2003-224054 A, a wafer is held by a mechanical clamp, and a force is exerted thereon. Thus, a mechanical force acts in a normal direction of the wafer, a flaw or a dent occurs to a wafer surface, and that might cause a crack in the wafer.

SUMMARY

The present disclosure has been made for solving the above-described problems, and an object thereof is to obtain a tension generation device and a semiconductor manufacturing device that can inhibit a flaw or a dent of a wafer surface.

The features and advantages of the present disclosure may be summarized as follows.

According to an aspect of the present disclosure, a tension generation device includes a plurality of electrode pairs each including a first electrode and a second electrode; and a voltage application circuitry that is configured such that each of the plurality of electrode pairs is arranged so as to interpose an end portion of a wafer by the first electrode and the second electrode in a direction perpendicular to a principal surface of the wafer, and a voltage is applied between the first electrode and the second electrode of each of the plurality of electrode pairs in a state where the first electrode and the second electrode protrude to an outer side than the wafer when seen in the direction perpendicular to the principal surface of the wafer.

Other and further objects, features and advantages of the disclosure will appear more fully from the following description.

BRIEF DESCRIPTION OF DRAWINGS

FIGS. 3 and 4 are diagrams for explaining a mechanism of tension generation according to the first embodiment.

DESCRIPTION OF EMBODIMENTS

Figure 1:
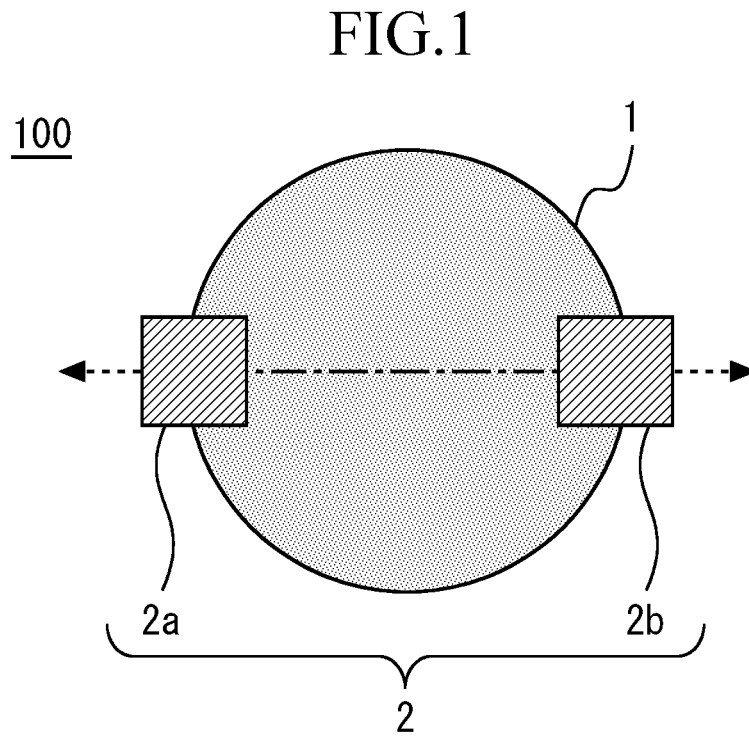
FIG. 1 is a plan view of a tension generation device according to a first embodiment.

A tension generation device and a semiconductor manufacturing device according to each embodiment will be described with reference to the accompanying drawings. Components identical or corresponding to each other are indicated by the same reference characters, and repeated description of them is avoided in some cases.

First Embodiment

FIG. 1 is a plan view of a tension generation device 100 according to a first embodiment. FIG. 1 illustrates a state where a wafer 1 is placed on a tension generation device 100. The tension generation device 100 is a part of a semiconductor manufacturing device that will be described later, for example. The tension generation device 100 is used when a substrate such as a semiconductor wafer is fixed and held to an electrostatic chuck, for example. In particular, the tension generation device 100 is used for properly correcting a warp of the substrate.

The tension generation device 100 has a plurality of tension generation mechanisms 2. In the example in FIG. 1, as the tension generation mechanisms 2 for pulling the wafer 1, two tension generation mechanisms 2a and 2b are arranged in positions in the wafer 1 that are opposed at 180 degrees. In order to uniformly pull the wafer 1 in a radial direction, the tension generation mechanisms 2 may be arranged in three or more parts of the wafer 1. In the present embodiment, for convenience of delivery in a case where the wafer 1 is conveyed onto a stage, the two tension generation mechanisms 2a and 2b are provided.

Figure 2:
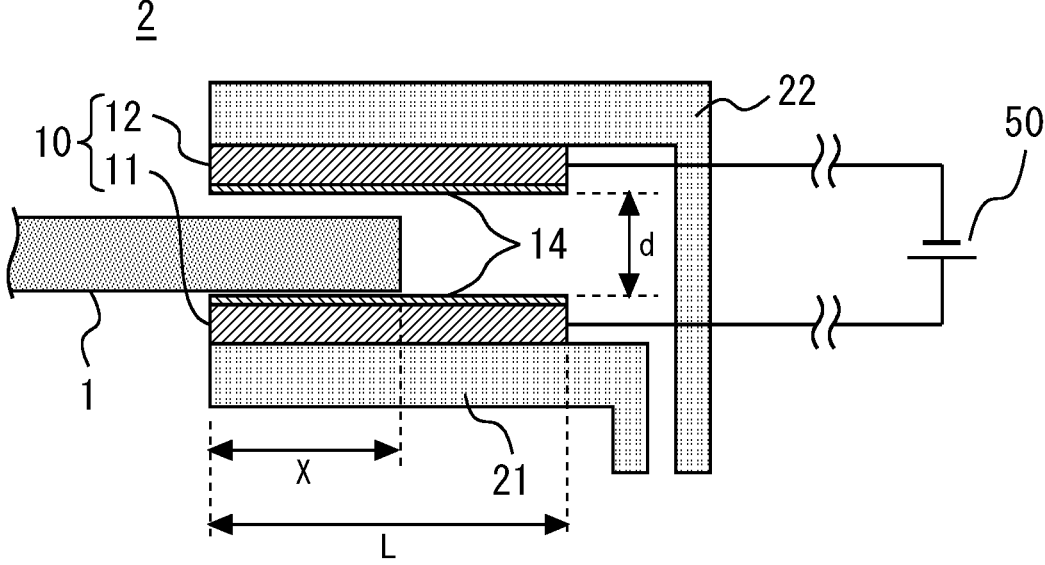
FIG. 2 is a cross-sectional view of the tension generation mechanism according to the first embodiment.

FIG. 2 is a cross-sectional view of the tension generation mechanism 2 according to the first embodiment. FIG. 2 illustrates a peripheral portion of the wafer 1. Each of the plurality of tension generation mechanisms 2 has an electrode pair 10. Each of the electrode pairs 10 has a first electrode 11 and a second electrode 12. Insulation layers 14 are provided to surfaces of the first electrode 11 and the second electrode 12. In the example in FIG. 2, the first electrode 11 contacts with the wafer 1 via the insulation layer 14, and the second electrode 12 is spaced apart from the wafer 1. A portion in which the tension generation mechanism 2 supports the wafer 1 is preferably a portion in the wafer 1 and at several millimeters from an outermost periphery, the portion being in general not used as a normal chip.

The insulation layer 14 is formed of a material more flexible than silicon, for example. The first electrode 11 and the second electrode 12 are coated with such a material, an occurrence of a flaw or a dent to the wafer 1 can be inhibited. Specifically, the insulation layer 14 preferably has a Young's modulus lower than 130 GPa. The insulation layer 14 is formed of a PI (polyimide)-based, fluorine-based, silicone-based, or acrylic material, for example. The insulation layer 14 may be provided on a surface of at least one of the first electrode 11 and the second electrode 12, the surface being opposed to the wafer 1. For example, the insulation layer 14 may be provided only to the first electrode 11 that contacts with the wafer 1 in FIG. 2. The insulation layer 14 may not be provided.

The first electrode 11 and the second electrode 12 are respectively held by base members 21 and 22. The base member 21 supports an end portion of the wafer 1. The base member 22 is arranged above the end portion of the wafer 1. The base member 22 has an eaves shape.

A voltage application circuitry is configured to apply a voltage between the first electrode 11 and the second electrode 12 in each of the plurality of electrode pairs 10. The voltage application circuitry is a power source 50 for applying the voltage between the first electrode 11 and the second electrode 12, for example. The voltage application circuitry may be a circuit such as wiring that connects the power source 50, the first electrode 11, and the second electrode 12 together. The power source 50 is a direct-current power source, an alternating-current power source, a pulse power source, or the like.

As illustrated in FIG. 2, each of the electrode pairs 10 is arranged so as to interpose the end portion of the wafer 1 by the first electrode 11 and the second electrode 12 in a direction perpendicular to a main surface of the wafer. When seen in the direction perpendicular to the main surface of the wafer 1, the first electrode 11 and the second electrode 12 protrude to outer sides than the wafer 1. The voltage application circuitry is configured such that in a state where the electrode pair 10 is arranged in such a manner, the voltage application circuitry applies the voltage between the first electrode 11 and the second electrode 12 in each of the plurality of electrode pairs 10.

It is preferable that the first electrode 11 and the second electrode 12 be configured to apply the voltage in the direction perpendicular to the main surface of the wafer 1. In other words, the voltage is preferably applied such that an electric field is generated in a normal direction of the wafer 1.

Figure 3:
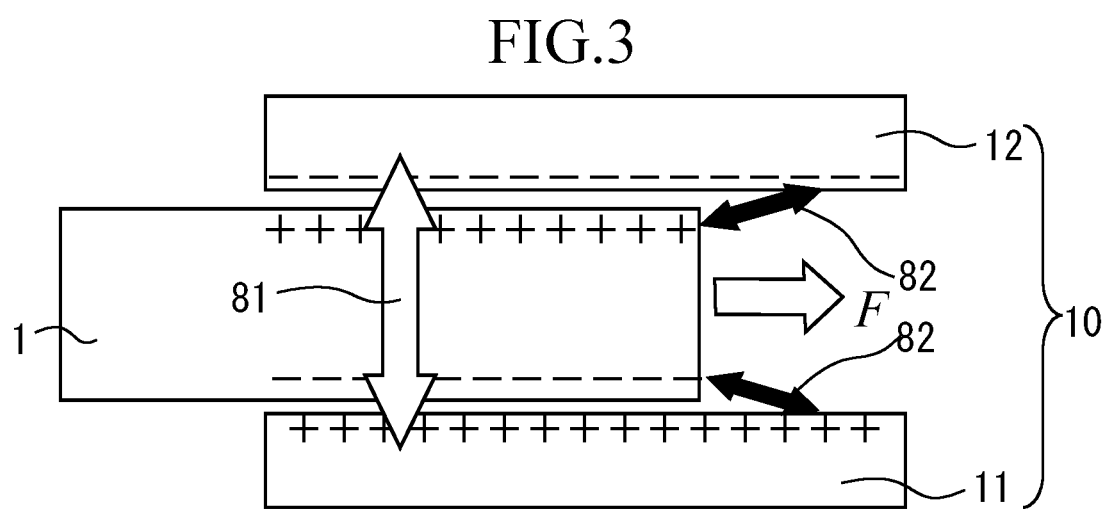
Figure 4:
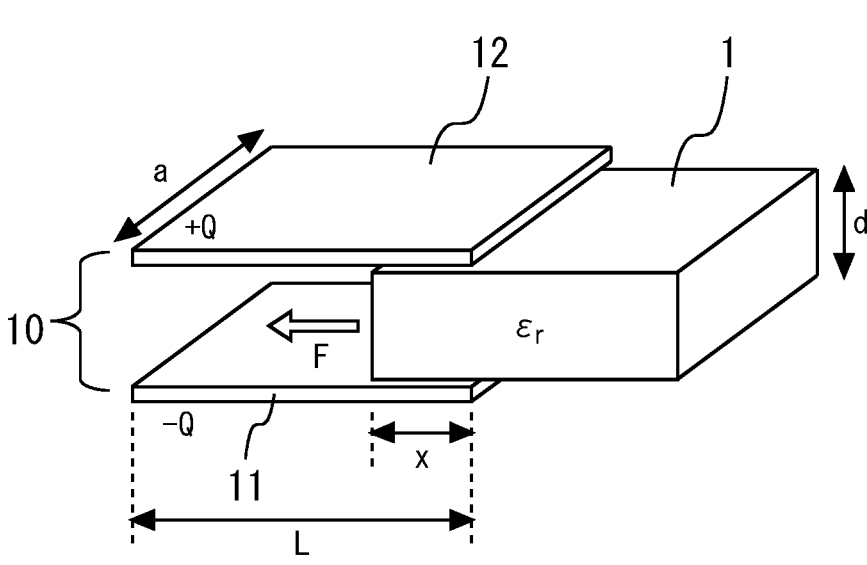

FIGS. 3 and 4 are diagrams for explaining a mechanism of tension generation according to the first embodiment. As illustrated in FIG. 3, when a voltage is applied to the electrode pair 10, electrostatic energy is accumulated between the first electrode 11 and the second electrode 12. A positive electric charge and a negative electric charge in an internal portion of the wafer 1 are respectively attracted to a negative electrode and a positive electrode, and polarization thereby occurs. In this case, electrostatic forces in an up-down direction cancel each other, the electrostatic forces being indicated by an arrow 81 in FIG. 3. Meanwhile, by electrostatic forces indicated by arrows 82, a tension F is exercised on the wafer 1 in a wafer radial direction.

By using FIG. 4, the tension F will further be described. In FIGS. 2 and 4, a character L denotes lengths of the first electrode 11 and the second electrode 12, a character x denotes an interposition length of the wafer 1, and a character d denotes a distance between the electrode pair 10. When the wafer 1 partially enters a portion between the electrode pair 10, in other words, L>x, the electrostatic energy between the electrode pair 10 is lowered due to polarization of the wafer 1. As the wafer 1 more deeply enters the portion between the electrode pair 10, the electrostatic energy to be accumulated between the electrode pair 10 is more lowered. Thus, a force is generated in the wafer 1 in a direction in which the electrostatic energy is lowered. This force acts to draw the wafer 1 into the portion between the electrode pair 10. In other words, the tension F is exercised on the wafer 1. Accordingly, the wafer 1 is pulled in an outer periphery direction, and a warp of the wafer 1 can thereby be corrected.

Note that no relationship is present between a connection direction of the power source 50 and a generation direction of the tension F. In other words, either one of the first electrode 11 and the second electrode 12 may be set as the positive electrode.

The tension F generated in the wafer 1 can be expressed by the following expression (1). Here, $\varepsilon_r$ denotes Si relative permittivity=12, $\varepsilon_0$ denotes permittivity of vacuum=8.8×10⁻12, a denotes an electrode width, and V denotes a voltage applied between the first electrode 11 and the second electrode 12.

[Math. 1]

$$F = \frac{\varepsilon_0 a V^2 (\varepsilon_r - 1)}{2d} \qquad (1)$$

When L=x, the electrostatic energy is not lowered even when the wafer 1 enters the position where L=x or a deeper position of the electrode pair 10. Thus, the tension F is not generated that draws the wafer 1 into the portion between the electrode pair 10. Consequently, it is necessary that L>x, in other words, the first electrode 11 and the second electrode 12 protrude to outer sides than the wafer 1 when seen in the direction perpendicular to the main surface of the wafer 1.

In order to correct a bend of the wafer 1, a tension at the same magnitude as a minimum buckling load may be generated in the radial direction. The minimum buckling load is expressed by the following expression (2).

[Math. 2]

$$F_m = \frac{\pi^2 E a d^3}{12 l^2} \qquad (2)$$

Here, Si Young's modulus E=200 GPa, d=wafer thickness=100 μm, a=30 mm, diameter 1 of wafer 1=300 mm, and V=2 kV are set, from the expressions (1) and (2), both of the tension F and the minimum buckling load $F_m$ are values equivalent to or smaller than 6×10⁻² [N]. It may be understood that for example, when d=100 μm is set, a warp can be inhibited. As expressed by the expression (1), as the distance d is extended, the applied voltage V necessary for generating the same tension F becomes higher. A power source of about several kilovolts is a generic power source that is in general used for an electrostatic suction stage. Taking into consideration parameters such as the voltage V and the distance d, when an interval d between the first electrode 11 and the second electrode 12 is 40 μm or greater to 200 μm or smaller, for example, in a state where the voltage V is applied, the warp can be inhibited.

Figure 5:
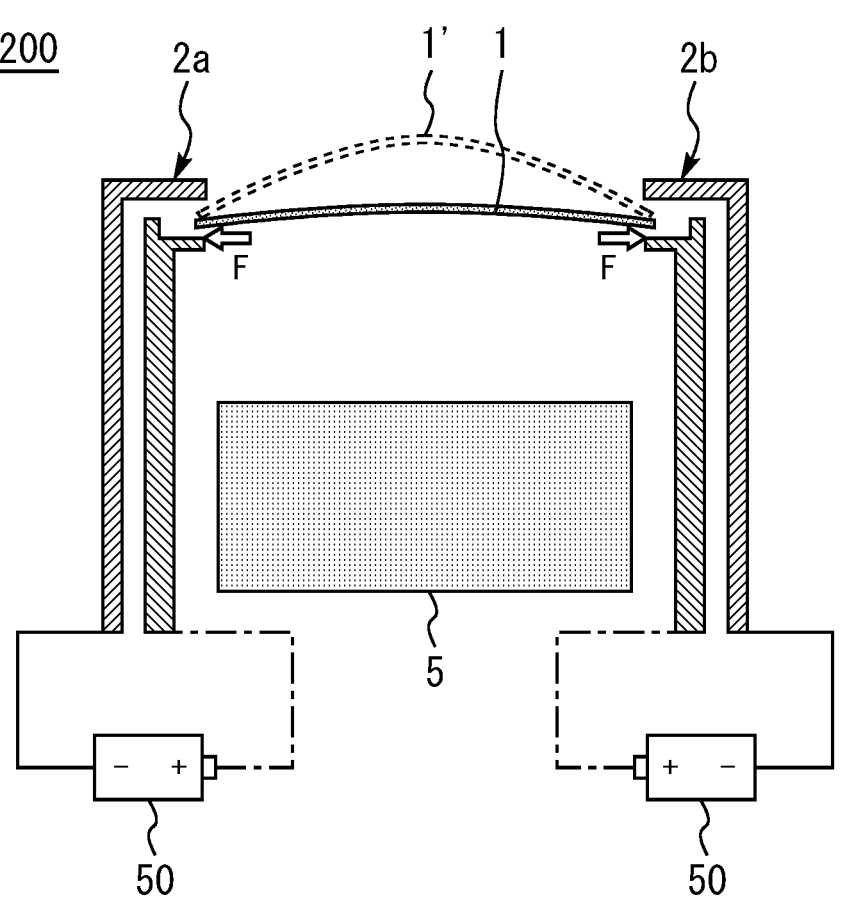
FIG. 5 is a diagram for explaining a configuration of a semiconductor manufacturing device according to the first embodiment.

FIG. 5 is a diagram for explaining a configuration of a semiconductor manufacturing device 200 according to the first embodiment. The semiconductor manufacturing device 200 includes the tension generation device 100 and a chuck stage 5. The chuck stage 5 is an electrostatic chuck, for example. In the tension generation device 100 of the present embodiment, the tension F is exerted in a radial direction of a deformed wafer 1', and the deformation can thereby be corrected as the wafer 1. As illustrated in FIG. 4, the deformation of the wafer 1 is corrected above the chuck stage 5, for example, and the wafer 1 is thereafter mounted on the chuck stage 5. Accordingly, the wafer 1 can uniformly be sucked by the chuck stage 5.

Figure 6:
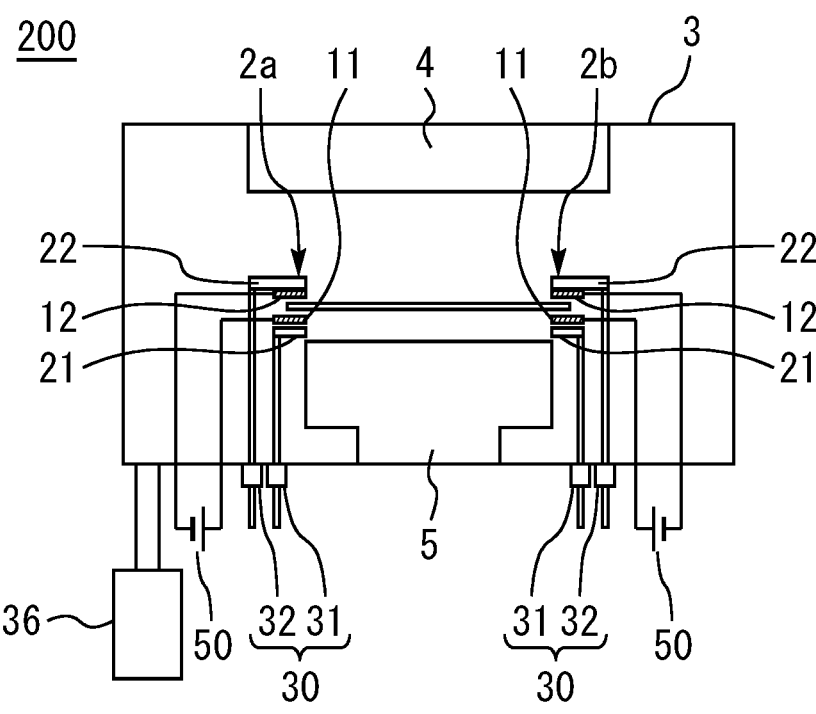
FIG. 6 is a diagram for explaining a configuration in a case where the semiconductor manufacturing device according to the first embodiment is a sputtering device.

FIG. 6 is a diagram for explaining a configuration in a case where the semiconductor manufacturing device 200 according to the first embodiment is a sputtering device. In the semiconductor manufacturing device 200, a sputtering target 4, the chuck stage 5, and the tension generation mechanism 2 are housed in a housing 3. An inside of the housing 3 is evacuated by a vacuum pump 36. The wafer 1 is placed on the base member 21 by a conveyance hand that is not illustrated. Subsequently, the base member 22 approaches the wafer 1.

In this state, a direct-current voltage is applied between the electrode pair 10 by the power source 50. Accordingly, the tension is generated in the wafer 1, and the warp of the wafer 1 is corrected. While a state is maintained where the tension is exercised on the wafer 1, the wafer 1 is placed on the chuck stage 5 by a movement mechanism 30 and is held by the chuck stage 5.

In this state, the voltage of the power source 50 is turned off, and the wafer 1 can thereby be placed on the chuck stage 5 in a state where the warp of the wafer 1 is inhibited. Consequently, the wafer can uniformly be placed on an electrostatic chuck stage.

In the example illustrated in FIG. 6, the movement mechanism 30 has a portion 31 that moves the base member 21 in the up-down direction and a portion 32 that moves the base member 22 in the up-down direction. In the present embodiment, the warp of the wafer 1 is corrected above the chuck stage 5. Thus, it is sufficient that the movement mechanism 30 can move the base members 21 and 22 in the up-down direction.

Figure 7:
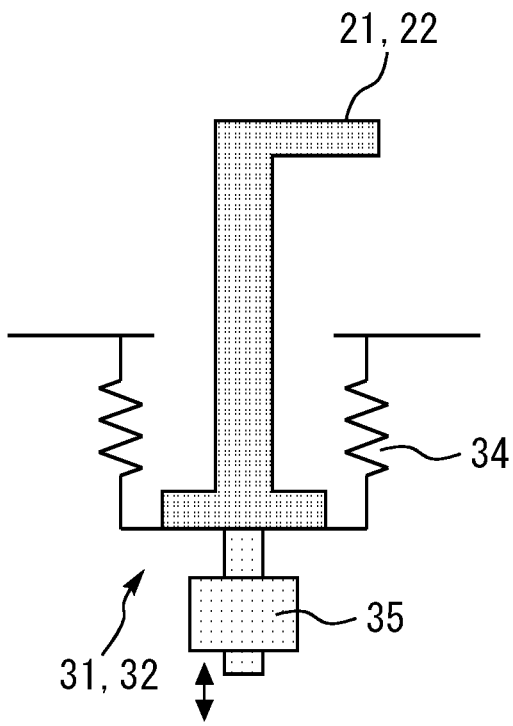
FIG. 7 is a diagram for explaining an example of the movement mechanism according to the first embodiment.

FIG. 7 is a diagram for explaining an example of the movement mechanism 30 according to the first embodiment. The portions 31 and 32 of the movement mechanism 30 can be realized by a combination of an elastic bellows 34 and an actuator 35 such as a stepping motor, for example.

The tension generation mechanism 2 may not be provided above the chuck stage 5, and a position for correcting the warp of the wafer 1 with respect to the chuck stage 5 is not limited. The movement mechanism 30 is not limited to a mechanism that moves in the up-down direction, but it is sufficient that the movement mechanism 30 is configured to be capable of arranging, on the chuck stage 5, the wafer 1 in a state the tension is exercised thereon by the tension generation device 100. In the example in FIG. 6, the movement mechanism 30 is provided to each of the tension generation mechanisms 2. This is not restrictive, and the movement mechanism 30 shared by a plurality of tension generation mechanisms 2 may be provided.

As described above, in the present embodiment, the wafer is not deformed by a mechanical force, but a tension can be generated only in the radial direction of the wafer 1 by application of the voltage. Consequently, the warp of the wafer 1 can be corrected while a flaw or a dent of a wafer surface is inhibited.

In the present embodiment, a description is made about a configuration, as an example, in which the wafer 1 is mounted on the first electrode 11 and the second electrode 12 is spaced apart from the wafer 1. At least one of the first electrode 11 and the second electrode 12 is spaced apart from the wafer 1, and an occurrence of a flaw or a dent to the wafer 1 can thereby further be inhibited. This is not restrictive, and the voltage may be applied to the electrode pair 10 in a state where both of the first electrode 11 and the second electrode 12 are spaced apart from the wafer 1. In this case, a member for holding the wafer 1 may separately be provided. In a range in which a flaw or a dent does not occur to the wafer 1, the voltage may be applied to the electrode pair 10 in a state where both of the first electrode 11 and the second electrode 12 contact with the wafer 1.

The voltage application circuitry may be configured to be capable of applying voltages of different magnitudes to a plurality of electrode pairs 10. The voltage application circuitry may be configured to be capable of applying voltages to the plurality of electrode pairs 10 at different timings. Accordingly, it becomes possible to adjust a balance of the tension exercised on the wafer and to adjust a wafer position. In the above-described example, the power source 50 is provided to each of the tension generation mechanisms 2, but the power source 50 shared by the plurality of tension generation mechanisms 2 may be provided.

In the present embodiment, a description is made about an example where the wafer 1 is a silicon wafer. This is not restrictive, and the wafer 1 may be made with a wide-bandgap semiconductor. The wide-bandgap semiconductor is formed of silicon carbide, a gallium-nitride-based material, or diamond.

Meanwhile, technical features explained in the embodiment may be appropriately combined to use.

Hereinafter, various aspects of the present disclosure will be collectively described as appendixes.

(Appendix 1)

A tension generation device comprising:

a plurality of electrode pairs each including a first electrode and a second electrode; and a voltage application circuitry that is configured such that each of the plurality of electrode pairs is arranged so as to interpose an end portion of a wafer by the first electrode and the second electrode in a direction perpendicular to a principal surface of the wafer, and a voltage is applied between the first electrode and the second electrode of each of the plurality of electrode pairs in a state where the first electrode and the second electrode protrude to an outer side than the wafer when seen in the direction perpendicular to the principal surface of the wafer.

(Appendix 2)

The tension generation device according to appendix 1, wherein a tension is exercised on the wafer by applying the voltage between the first electrode and the second electrode.

(Appendix 3)

The tension generation device according to appendix 1 or 2, wherein the first electrode and the second electrode are configured to apply the voltage in the direction perpendicular to the principal surface of the wafer.

(Appendix 4)

The tension generation device according to any one of appendixes 1 to 3, wherein at least one of the first electrode and the second electrode is spaced apart from the wafer.

(Appendix 5)

The tension generation device according to any one of appendixes 1 to 4, wherein, in a state where the voltage is applied, an interval between the first electrode and the second electrode is 40 μm or greater to 200 μm or smaller.

(Appendix 6)

The tension generation device according to any one of appendixes 1 to 5, wherein an insulation layer is provided to a surface of at least one of the first electrode and the second electrode, the surface being opposed to the wafer, and the insulation layer has a Young's modulus lower than 130 GPa.

(Appendix 7)

The tension generation device according to any one of appendixes 1 to 6, wherein the voltage application circuitry is configured to be capable of applying voltages of different magnitudes to the plurality of electrode pairs.

(Appendix 8)

The tension generation device according to any one of appendixes 1 to 7, wherein the voltage application circuitry is configured to be capable of applying voltages to the plurality of electrode pairs at different timings.

(Appendix 9)

The tension generation device according to any one of appendixes 1 to 8, wherein the wafer is made with a wide band gap semiconductor.

(Appendix 10)

The tension generation device according to appendix 9, wherein the wide band gap semiconductor is silicon carbide, gallium-nitride-based material or diamond.

(Appendix 11)

A semiconductor manufacturing device comprising:

the tension generation device according to any one of appendixes 1 to 10;

a chuck stage; and a movement mechanism that is configured to arrange, on the chuck stage, the wafer on which the tension is exercised by the tension generation device.

In a tension generation device and a semiconductor manufacturing device according to the present disclosure, a tension can be generated only in a radial direction of a wafer by application of a voltage. Consequently, a flaw or a dent of the wafer surface can be inhibited.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2023-061643, filed on Apr. 5, 2023 including specification, claims, drawings and summary, on which the Convention priority of the present application is based, are incorporated herein by reference in its entirety.

The invention claimed is:

1. A tension generation device comprising:

a plurality of electrode pairs each including a first electrode and a second electrode; and a voltage application circuitry that is configured such that each of the plurality of electrode pairs is arranged so as to interpose an end portion of a wafer by the first electrode and the second electrode in a direction perpendicular to a principal surface of the wafer, and a voltage is applied between the first electrode and the second electrode of each of the plurality of electrode pairs in a state where the first electrode and the second electrode protrude to an outer side than the wafer when seen in the direction perpendicular to the principal surface of the wafer.

2. The tension generation device according to claim 1, wherein a tension is exercised on the wafer by applying the voltage between the first electrode and the second electrode.

3. The tension generation device according to claim 1, wherein the first electrode and the second electrode are configured to apply the voltage in the direction perpendicular to the principal surface of the wafer.

4. The tension generation device according to claim 1, wherein at least one of the first electrode and the second electrode is spaced apart from the wafer.

5. The tension generation device according to claim 1, wherein, in a state where the voltage is applied, an interval between the first electrode and the second electrode is 40 μm or greater to 200 μm or smaller.

6. The tension generation device according to claim 1, wherein an insulation layer is provided to a surface of at least one of the first electrode and the second electrode, the surface being opposed to the wafer, and the insulation layer has a Young's modulus lower than 130 GPa.

7. The tension generation device according to claim 1, wherein the voltage application circuitry is configured to be capable of applying voltages of different magnitudes to the plurality of electrode pairs.

8. The tension generation device according to claim 1, wherein the voltage application circuitry is configured to be capable of applying voltages to the plurality of electrode pairs at different timings.

9. The tension generation device according to claim 1, wherein the wafer is made with a wide band gap semiconductor.

10. The tension generation device according to claim 9, wherein the wide band gap semiconductor is silicon carbide, gallium-nitride-based material or diamond.

11. A semiconductor manufacturing device comprising:

the tension generation device according to claim 1;

a chuck stage; and a movement mechanism that is configured to arrange, on the chuck stage, the wafer on which tension is exercised by the tension generation device.

* * * * *